United States Patent [19]

Gardner et al.

[11] Patent Number: 5,362,685
[45] Date of Patent: Nov. 8, 1994

[54] METHOD FOR ACHIEVING A HIGH QUALITY THIN OXIDE IN INTEGRATED CIRCUIT DEVICES

[75] Inventors: Mark I. Gardner, Red Rock; Henry J. Fulford, Jr.; Jay J. Seaton, both of Austin, all of Tex.

[73] Assignee: Advanced Micro Devices, Inc., Sunnyvale, Calif.

[21] Appl. No.: 969,708

[22] Filed: Oct. 29, 1992

[51] Int. Cl.$^5$ .................................. H01L 21/266
[52] U.S. Cl. ................................ 437/238; 437/43; 437/931; 437/979
[58] Field of Search .............. 437/38, 43, 97, 235, 437/238, 931, 934, 976, 979; 148/DIG. 7, DIG. 97

[56] References Cited

U.S. PATENT DOCUMENTS

| | | | |
|---|---|---|---|
| 3,945,856 | 3/1976 | Koenig et al. | 437/931 |
| 4,329,773 | 5/1982 | Geipel, Jr. et al. | 437/238 |
| 4,517,732 | 5/1985 | Oshikawa | 437/43 |
| 4,567,645 | 2/1986 | Cavanagh et al. | 437/976 |
| 5,057,463 | 10/1991 | Bryant et al. | 437/238 |
| 5,208,173 | 5/1993 | Yamada et al. | 437/43 |
| 5,215,934 | 6/1993 | Tzeng | 437/979 |
| 5,225,361 | 7/1993 | Kakiuchi et al. | 437/43 |

*Primary Examiner*—Tom Thomas
*Assistant Examiner*—C. Chaudhori
*Attorney, Agent, or Firm*—Skjerven, Morrill, MacPherson, Franklin & Friel

[57] ABSTRACT

The quality of both a gate oxide and a tunnel oxide in a P-well active area of a CMOS EEPROM process is improved by reducing the field edge pullback arising from wet chemical etch steps prior to the growth of the gate and tunnel oxides. A first oxide is grown, and an implant is performed through the first oxide to form an implanted layer. The surface of the first oxide is then cleaned without removing all of the first oxide overlying the implanted layer. An anneal step then activates the implanted layer to form a heavily-doped region, after which the remaining first oxide is then removed. A second oxide is then grown, and a region of the second oxide is removed overlying the heavily-doped region. Lastly, a tunnel oxide is grown over the heavily-doped region while re-oxidizing the second oxide to form a gate oxide thicker than the tunnel oxide.

16 Claims, 7 Drawing Sheets

METHOD FOR ACHIEVING A HIGH QUALITY THIN OXIDE IN INTEGRATED CIRCUIT DEVICES

BACKGROUND OF THE INVENTION

1. Field of the Invention

This invention relates to the fabrication of semiconductor devices, and more specifically, to the growth of high quality oxides from the surface of a semiconductor substrate.

2. Description of Related Art

The importance of high quality oxides in the fabrication of semiconductor devices cannot be overemphasized. Many broad categories of commercial devices, such as Electrically Erasable Programmable Read-Only Memories (EEPROMS), Dynamic Random Access Memories (DRAMs), and more recently, even high-speed basic logic functions, owe their commercialization to the reproducibility of high quality, very thin oxide layers.

Major improvements in gate oxide quality have been achieved by improved cleaning techniques, the addition of HCL/TCA to the gate oxidation process, and higher purity gasses and chemicals. RCA cleaning techniques are described in "Dependence of Thin Oxide Quality on Surface Micro-Roughness" by T. Ohmi, et. al., IEEE Transactions on Electron Devices, Vol. 39, Number 3, March 1992. Other techniques have incorporated different gas ($NH_3$, ONO, WET $O_2$) schemes in the gate oxidation cycle other than the conventional $O_2$ with HCL or TCA. Also considerable progress has been made with single wafer RTA gate processing, as is described in "Effect of Rapid Thermal Reoxidation on the Electrical Properties of Rapid Thermally Nitrided Thin-Gate Oxides", by A. Joshi, et. al., IEEE Transactions on Electron Devices, Vol. 39, Number 4, April 1992.

These techniques refer to "gate oxides" as in the gate of an MOS transistor, but are usually applicable to any thin (usually less than 300Å) oxide. The "tunnel" oxide of an EEPROM process technology is a very thin gate oxide (usually less than 100Å), with the somewhat unusual requirement that it be grown above a very heavily-doped N+ region. Oxides grown from heavily-doped substrate surfaces are generally considered to be lower in quality than those grown from more lightly doped surfaces, as would be the case for most MOS transistor processes.

The growing and subsequent removing of a KOOI oxide is used to eliminate the remnant KOOI ribbon of nitride which forms around the active area at the LOCOS edge (or field edge) during the previous field oxidation. (Silicon nitride in a steam oxidation environment decomposes into ammonia and silicon dioxide. The ammonia diffuses down through the field oxide until reaching the silicon surface, where it reacts to form a silicon nitride, and leaving a ribbon of nitride at the silicon/silicon dioxide interface around the edge of the active area.) In a non-EEPROM CMOS process (not incorporating a tunnel oxide for EEPROM structures) the KOOI oxide is commonly used as an implant oxide for $V_T$ controlling implants, and is subsequently removed and followed by the gate oxidation and polysilicon deposition for FET's.

Unfortunately, processes adequate for fabricating devices having high quality thin oxides are generally not adequate for fabricating devices having very thin high quality oxides.

SUMMARY OF THE INVENTION

The present invention advantageously eliminates an etch step and minimizes the durations of other etch steps in certain processes to improve the quality of subsequently grown oxides, including the tunnel oxides of EEPROM devices. In one embodiment, an implanted layer is formed in a semiconductor body by implanting through a first oxide, after which the implanted layer is annealed with at least some of the first oxide remaining over the implanted layer to form a heavily-doped region. The first oxide is then removed to expose the surface over the heavily-doped region, and a high quality oxide is grown upon the exposed semiconductor surface over the heavily-doped region.

DETAILED DESCRIPTION OF THE PREFERRED EMBODIMENTS

We have found that minimizing field oxide pullback (see FIGS. 1-3) from the active area edge results in a dramatic quality improvement of subsequently grown thin oxides, and particularly those grown abutting the active area edge. Additionally, reducing the number of times an active area is etched to remove an oxide improves the integrity of a subsequently grown thin oxide. Furthermore, minimizing the amount of etch time received by the active area surface during etch operations greatly improves the quality of a subsequently grown thin oxide. This is particularly true for etch operations closer in process sequence to the growth of the subsequent thin oxide.

FIGS. 4-10 are cross-sectional views illustrating a sequence of process steps for forming gate and tunnel oxides in a P-well active area of a CMOS EEPROM process. The gate oxide is used to fabricate N-channel MOS transistors, and the tunnel oxide is used to fabricate a structure useful to an EEPROM cell element.

Figure 4:
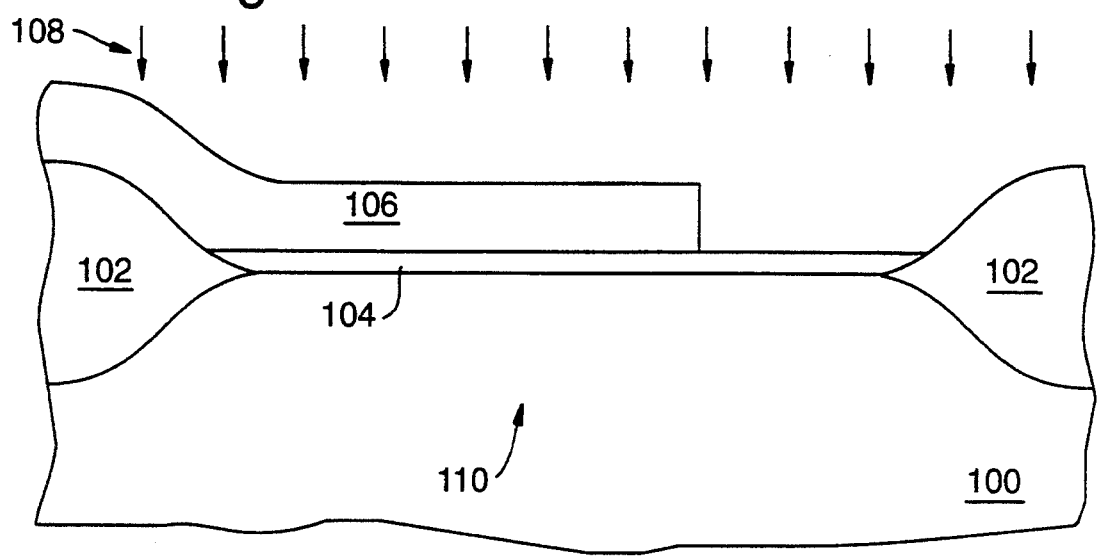
FIGS. 4-10 are cross-sectional views illustrating a sequence of process steps for forming gate and tunnel oxides in a P-well active area of a CMOS EEPROM process.
Figure 5:
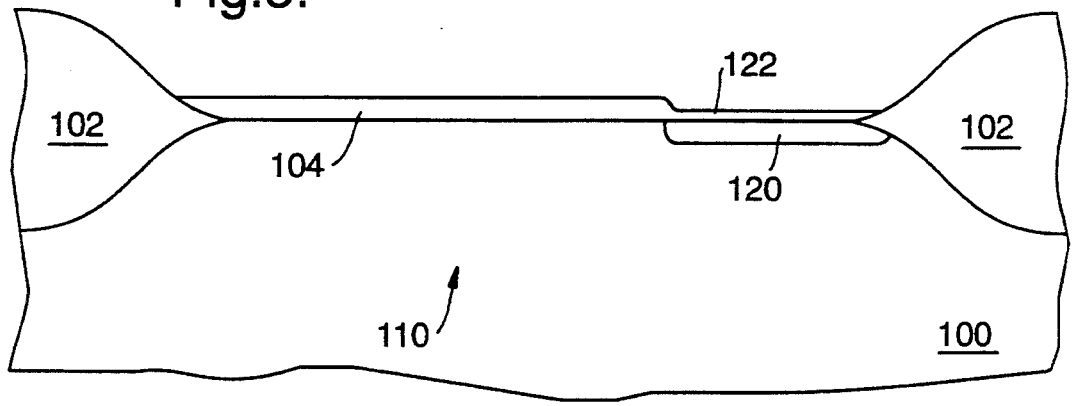

Referring to FIG. 4, P-well field oxides 102 are formed using a LOCOS process upon substrate 100. P-well field oxides 102 define a P-well active area 110 between the field oxides 102. KOOI oxide 104 then is grown in a steam oxidation environment to a thickness of approximately 300Å. Photoresist then is applied and defined to form photoresist layer 106 which exposes a portion of the KOOI oxide 104 over the P-well active area 110.

Next, a phosphorus implant 108 is implanted through the exposed KOOI oxide and into the substrate 100 in the P-well active area 110 for the EEPROM process of this embodiment. Other regions of the substrate are masked by the photoresist layer 106. Preferably photoresist layer 106 is then removed and the surface is prepared for annealing by an RCA clean operation, resulting in the structure shown in FIG. 5. Phosphorus implant layer 120 has been created by the heavy dose of the phosphorus implant 108. Due to the implant damage to the KOOI oxide which was exposed to the phosphorus implant 108, the RCA clean operation etches some of the implant-damaged KOOI oxide, resulting in etched KOOI oxide 122 approximately 100Å thick in the region above phosphorus implant layer 120. KOOI oxide 104 which was formerly protected by photoresist layer 106 and consequently not damaged by phosphorus implant 108 remains substantially unetched at 300Å thick.

Figure 6:
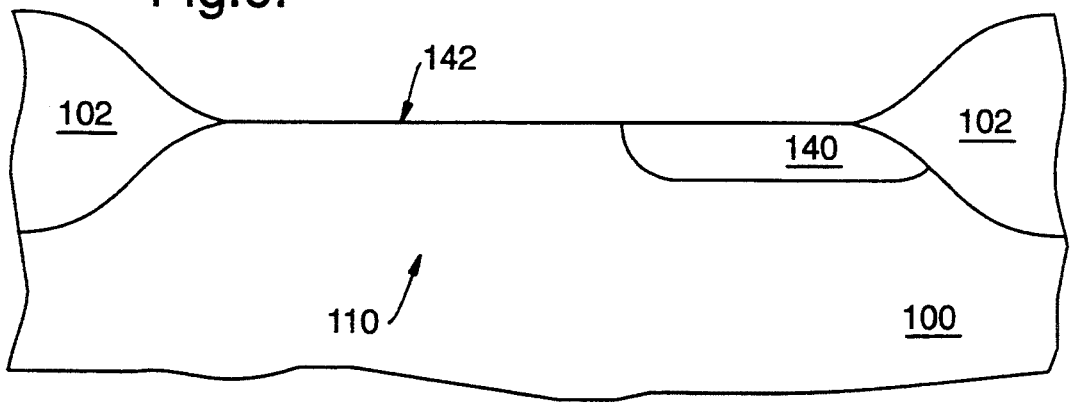
Figure 7:
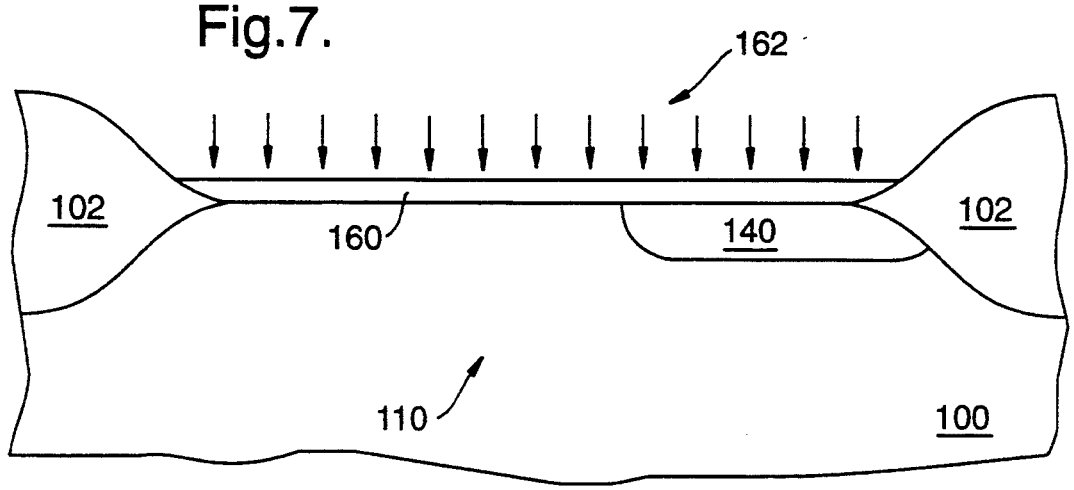

An anneal operation follows which both drives the phosphorus implant layer 120 into the substrate 100, thereby lowering the surface concentration of phosphorus, and activates the phosphorus implant, thereby forming an N+ region. Next, a short oxide etch removes the remaining KOOI oxide 104 and Etched KOOI oxide 122 from the surface of the P-well active area in preparation for gate oxidation. This pre-gate oxidation etch step may be a 1.7 minute dip in 10:1 HF. The resulting structure is shown in FIG. 6, and shows P-well active area surface 142 free of overlying oxide, and further shows the formation of N+ region 140, being deeper and broader than the previous unactivated phosphorus implant layer 120 due to the drive-in accomplished during the previous anneal step.

In an alternative process sequence, the KOOI oxide 104 is completely removed before the anneal operation rather than afterward. Referring to FIG. 4, after the phosphorus implant 108 is implanted through the exposed KOOI oxide and into the substrate 100, the photoresist layer 106 is removed. Next, the KOOI oxide 104 is removed by a pre-anneal etch using 10:1 HF, and the surface is prepared for annealing by an RCA clean operation. This results in a structure similar to that of FIG. 5, except that no KOOI oxide 104 and no etched KOOI oxide 122 are present, having both been removed by the pre-anneal etch. Phosphorus implant layer 120 results from the heavy dose of the phosphorus implant 108. The anneal operation follows which both drives the phosphorus implant layer 120 into the substrate 100 as before, thereby lowering the surface concentration of phosphorus, and activates the phosphorus implant as before, thereby forming an N+ region in the P-well active area 110. Next, a short oxide etch removes any remaining oxide from the surface of the P-well active area 110 which may have formed during the high temperature anneal operation in preparation for gate oxidation. This pre-gate oxidation etch step is a 1.7 minute dip in 10:1 HF. The resulting structure is shown in FIG. 6, and shows P-well active area surface 142 free of overlying oxide, and further shows the formation of N+ region 140, being deeper and broader than the previous unactivated phosphorus implant layer 120 due to the drive-in accomplished during the previous anneal step.

Continuing in the process sequence, a gate oxide is next formed over the P-well active area 110. This is preferably grown in a dry oxidation environment and results in the structure of FIG. 7. Gate oxide 160 is approximately 225Å thick. Preferably an in-situ anneal is performed at the conclusion of the gate oxidation cycle by changing the ambient gases in the oxidation furnace to an inert (e.g., Argon) annealing ambient, while continuing to apply a high temperature. Preferable annealing conditions are described in copending, commonly-assigned U.S. patent application Ser. No. 07/959,230, filed Oct. 9, 1992, which names Mark I. Gardner and Henry Jim Fulford, Jr. as inventors and is entitled "Method for Achieving a High Quality Thin Oxide Using a Sacrificial Oxide Anneal" (Attorney Docket No. M-2200 US), which application is incorporated herein by reference in its entirety. $V_{TI}$ Implant 162 is then implanted over the whole wafer to set the nominal threshold of MOS transistors to be fabricated later in the P-wells. This is a light boron implant which is applied without any masking photoresist (i.e. a "blanket implant") to both P-well regions and N-well regions (not shown). A separate $V_{TP}$ implant (not shown) is then implanted into the N-well regions (not shown) to adjust the threshold of P-channel MOS transistors to be fabricated later in the N-wells. To accomplish this, a photoresist layer is applied and defined to cover the P-wells while exposing the N-wells, the implant into the N-wells is performed, and the photoresist overlying the P-wells then removed.

Figure 8:
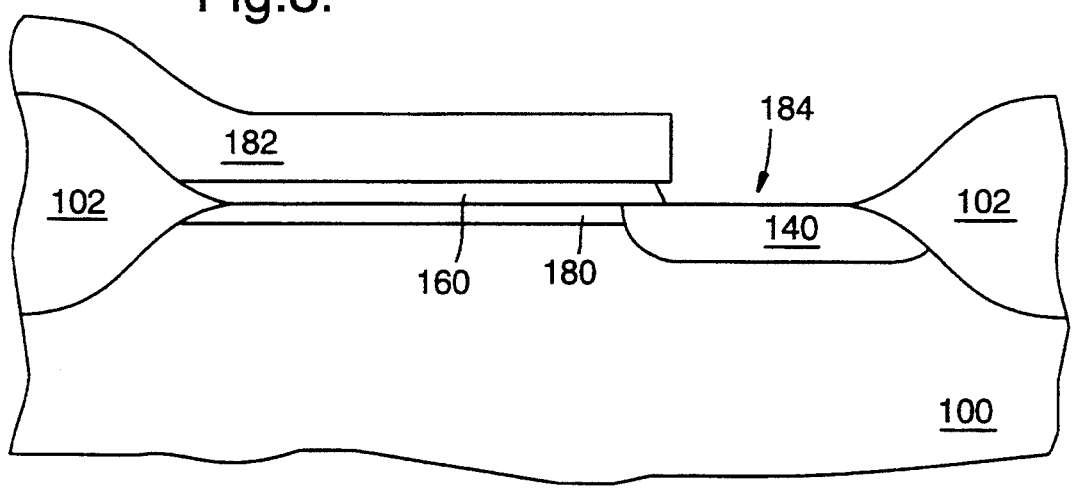
Figure 9:
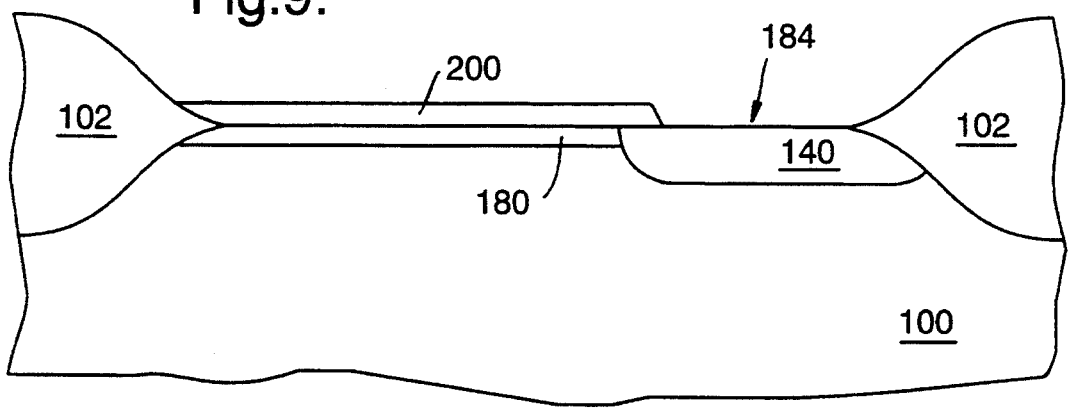

A photoresist layer is applied and defined to expose part of the gate oxide 160 over the N+ region 140, followed by an etch step to remove the exposed gate oxide. This tunnel opening etch is preferably a 0.2 minute dip in a 6:1 buffered oxide etchant which removes the 225Å of gate oxide to expose the surface of the substrate 100 over the N+ region 140. The resulting structure is shown in FIG. 8 and shows the N+ surface 184 exposed by the tunnel opening etch. Photoresist layer 182 defines the tunnel opening and protects the remainder of gate oxide 160 not overlying N+ region 140. The as-yet unactivated $V_{TI}$ implant layer 180 is shown under the gate oxide 160. $V_{TI}$ implant layer 180 is not shown extending into N+ region 140 because the doping density of heavily-doped N+ region 140 is far greater than that of $V_{TI}$ implant layer 180.

Next, the photoresist layer 182 is removed and an additional etch operation is performed to reduce the thickness of gate oxide 160 from 225Å down to approximately 140Å. This is accomplished with a 50 second dip in 50:1 HF, and results in the structure shown in FIG. 9. Etched gate oxide 200 is approximately 140Å thick. This 50 second dip also serves to remove any native oxide formed over N+ surface 184 subsequent to the etching of gate oxide 160.

Figure 10:
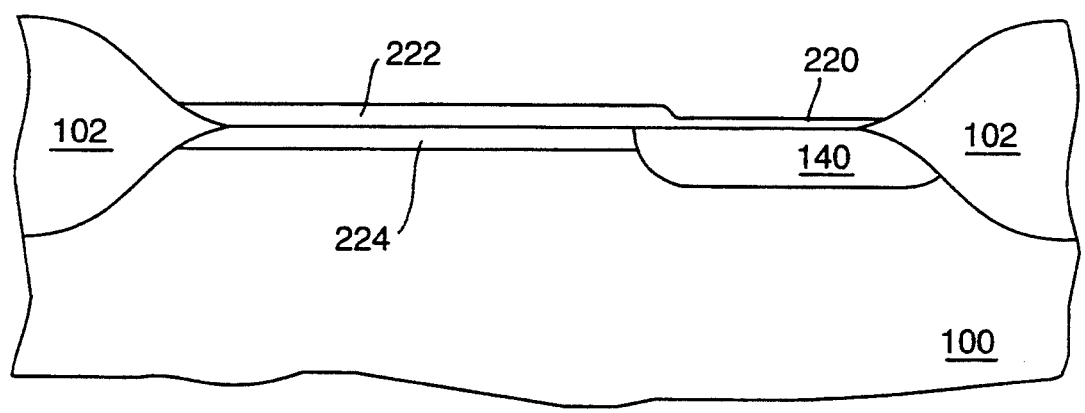

Lastly, an oxidation step both grows an oxide from N+ surface 184 over N+ region 140, and increases the thickness of the existing etched gate oxide 200. Referring to FIG. 10, tunnel oxide 220 is nominally 87Å thick, while re-oxidized gate oxide 222 is now nominally 180Å thick. The unactivated $V_{TI}$ implant layer 180 has been activated by the tunnel oxidation step, resulting in $V_{TI}$ layer 224.

Subsequent to this step a polysilicon layer is deposited, doped, and defined to form, in accordance with any of a variety of well-known processes, transistors, interconnect, and other features. In particular, the polysilicon is deposited above tunnel oxide 220 to form a structure useful to an EEPROM cell which will conduct a current through tunnel oxide 220 if the electric field across tunnel oxide 220 is high enough. Measurements of oxide quality can be made immediately after the polysilicon layer is patterned into useful structures.

We have found that minimizing the length of the three etch operations described above improves the quality of the subsequently grown tunnel oxide. Furthermore, the tunnel oxide quality is dramatically improved if the pre-anneal etch step is completely omitted. To investigate the quantitative effects on tunnel oxide quality, a study was conducted using wafers fabricated using the process flow of FIGS. 4–10. A summary of the oxidation cycle used to grow the gate oxide is described in Table 1 below.

TABLE 1

| STEP | GASSES | TEMP | TIME |
|---|---|---|---|
| I. Push/Stabilize | Low $O_2$/AR | Ramp to 800° C. Final Temp | t = 30 min. |
| II. Ramp to 900 | Low $O_2$/AR | 900° C. Final Temp | t = 30 min. |
| III. Oxidation | $O_2$ | 900° C. | t = 32 min. 15 sec. |
| IV. HCL Getter | HCL/AR | 900° C. | t = 9 min. |
| V. Oxidation | $O_2$ | 900° C. | t = 23 min. 45 sec. |
| VI. HCL Getter | HCL/AR | 900° C. | t = 9 min. |
| VII. Oxidation | $O_2$ | 900° C. | t = 23 min. 45 sec. |
| VIII. AR Anneal | AR | 900° C. | t = 0 min. |
| IX. Ramp Down to 800° C. | AR | 800° C. Final Temp | t = 30 min. |

As is shown, the gate oxidation proceeds as a three-stage oxidation cycle, with HCl gettering performed between the first and second stages, and again between the second and third stages. This procedure keeps the HCl away from both the silicon and the polysilicon interfaces, while still providing a high enough HCl concentration within the body of the gate oxide to getter any mobile ionic charge that may be present. HCl coming into contact with either a silicon or polysilicon interface will degrade that interface surface, and likewise degrade any oxide contiguous to that surface. After the third stage of oxidation, an in-situ gate oxide anneal is preferably performed, followed by a ramp-down in temperature. As mentioned previously, preferable annealing conditions are described in the Gardner, et. al. United States patent application referenced above.

Figure 11:
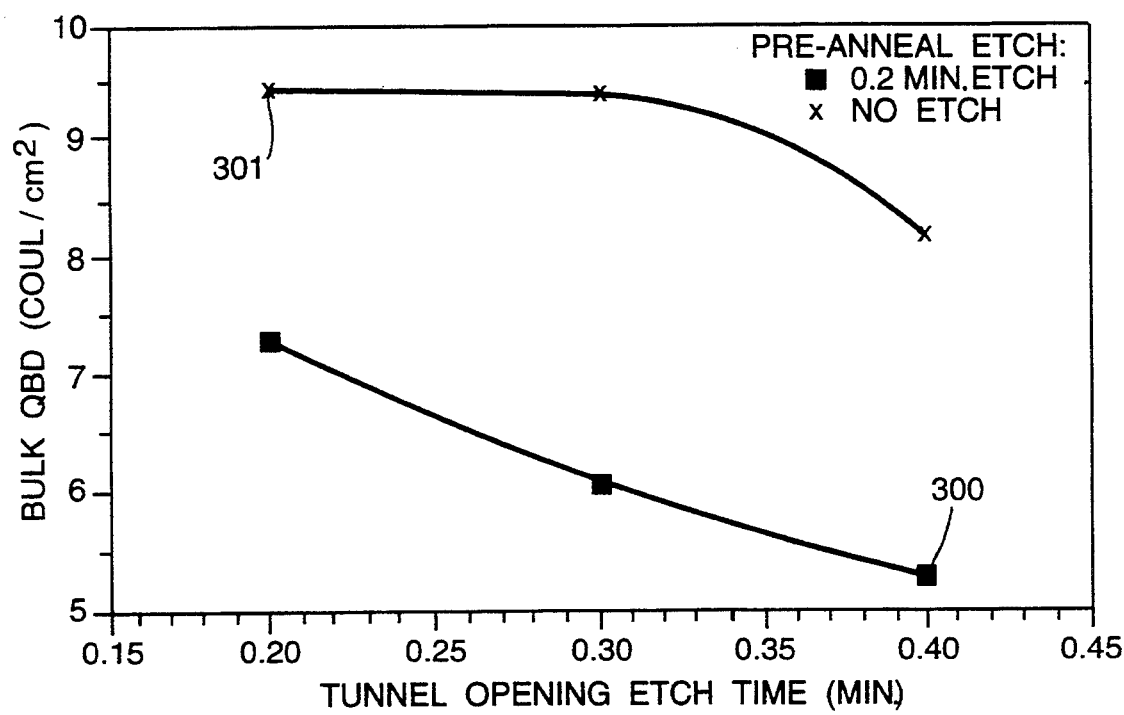
FIG. 11 is a chart which plots Bulk QBD measurements for various etch conditions.

This study investigated the effects on tunnel oxide quality of the pre-anneal etch, the pre-gate oxidation etch, and the tunnel opening etch. A matrix of different etch times were used in various wafer runs and measured for tunnel oxide quality. The pre-anneal etch was either a 0.2 minute etch in 10:1 HF, or was omitted altogether. The pre-gate oxidation etch times used were either 1.7 minutes or 1.3 minutes in 10:1 HF, and the tunnel opening etch were varied at either 0.4, 0.3, and 0.2 minutes in a 6:1 buffered oxide etchant. For these experiments dealing with etch times, the gate oxide was not annealed in-situ: FIG. 11 shows a "0 minute" anneal in Argon at the conclusion of the three gate oxidation cycles, followed by ramp-down to 800° over 30 minutes.

To determine the effects of the three etch steps on the quality of tunnel oxides grown from the P-well active area surface, both edge QBD and surface QBD measurements were made on structures using the tunnel oxide. QBD ("charge-to-breakdown") is a measure of the time-dependent breakdown characteristic of an oxide layer. It is measured by passing a constant current through the oxide under test (which conducts via Fowler-Nordheim tunneling), and noting the time at which the oxide breaks down electrically. Breakdown occurs due to the trapping of charge within the oxide, thereby gradually raising the electric field across the oxide until the oxide can no longer withstand the induced voltage. Higher quality oxides will trap less charge over time, and will therefore take longer to break down. The mathematical product of the forcing current times the measured time to breakdown gives rise to a charge value corresponding to the total charge passed through the oxide prior to breakdown. Higher QBD values reflect higher quality oxides.

The QBD test structures that were studied involved one structure that contained 370 tunnel opening cuts in a gate oxide region (SURFACE QBD structure). Since all of the tunnel opening cuts are within a large area of gate oxide, the LOCOS edge will not reach the 370 individual tunnel opening cuts of $1.2 \times 1.2$ $\mu m^2$ each. This makes the SURFACE QBD structure valuable for studying the impact that surface quality alone has upon oxide quality.

A second QBD structure was utilized to study the impact of the LOCOS edge and surface combined (BULK structure). The BULK structure consisted of an area of tunnel oxide of $62.5 \times 100$ $\mu m^2$ that is encompassed by a LOCOS edge. By using the two different structures one can distinguish whether an improvement in oxide quality is driven more by the surface or the LOCOS edge.

The BULK structure was used to determine the dependence of tunnel oxide QBD upon any edge effects. The measured results from the various process splits are plotted in FIG. 11. The pre-gate oxidation etch time was held at 1.7 minutes for all data points. The plotted curves show the measured BULK QBD as a function of both the tunnel opening etch time (ranging from 0.4 to 0.2 minutes) and the pre-anneal etch (either 0.2 minutes or omitted). As can be seen, the QBD increased from 5.3 coul/cm$^2$ (data point 300) to 9.46 coul/cm$^2$ (data point 301). Using transmission electron microscopy (TEM), an analysis was performed on samples corresponding to these two data points to measure the bird's beak pullback. The sample corresponding to data point 301 had 1200Å less bird's beak pullback than the sample corresponding to data point 300. Furthermore, the TEM analysis also revealed three distinct oxide steps at the edge of the active area region that are caused by the KOOI oxidation, the gate oxidation, and the tunnel oxidation. The result of less etch time was a reduction in both the pullback and in the relative distance between each of the oxide steps. These results imply that the bird's beak pullback phenomenon is an important parameter to control for oxide quality.

Figure 1:
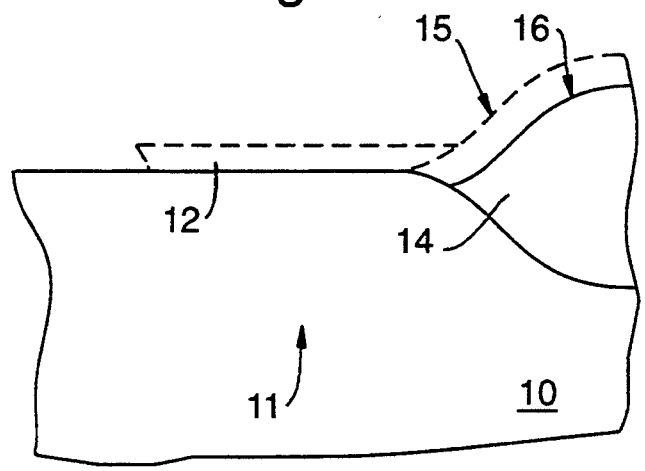
FIGS. 1-3 are cross-sectional views illustrating field edge pullback from an active area which occurs due to a prior etch of an active area oxide.
Figure 2:
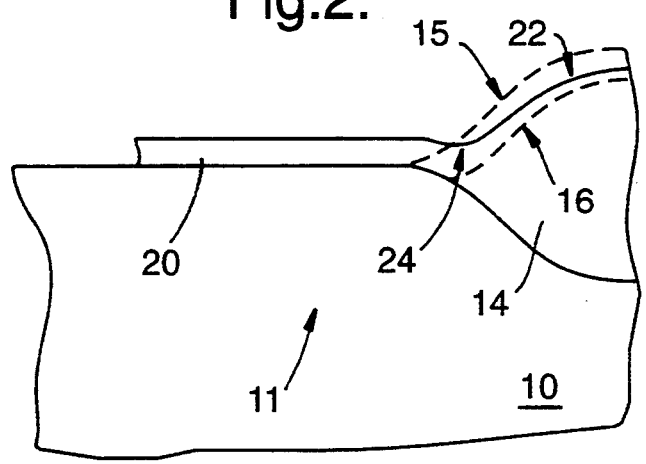

The bird's beak pullback phenomenon occurs when an oxide is removed from an active area, which causes a pullback of the field oxide edge away from the active area, and furthermore causes a thinning of the field oxide itself. FIG. 1 illustrates a portion of an active area 11 formed on a substrate 10 by a LOCOS process immediately after the removal of thin oxide 12 (shown by a dotted line). Field oxide 14 defines the active area 11 and has a top surface 16, resulting from the etching of former top surface 15 by the same etch which removes thin oxide 12. Since the etch rate of silicon dioxide by the etchant used is insensitive to the thickness of an oxide, the amount of oxide removed is a function of the etch time. In typical practice the field oxide 14 is thinned by an amount slightly exceeding the thickness of the thin oxide 12, which allows for a nominal overetch to ensure complete removal of the thin oxide 12. Referring to FIG. 2, a subsequent oxidation cycle forms thin oxide 20 over the active area 11, while increasing the thickness of field oxide 14 from former top surface 16 to top surface 22. The rate of growth of an oxide is dependent upon the thickness of the oxide. Consequently, the thickness of thin oxide 20 is greater than the increase in thickness of field oxide 14 from former top surface 16 to top surface 22, which gives rise to a dip 24 as the field oxide edge is now pulled back away from the flat region of the active area 11.

Figure 3:
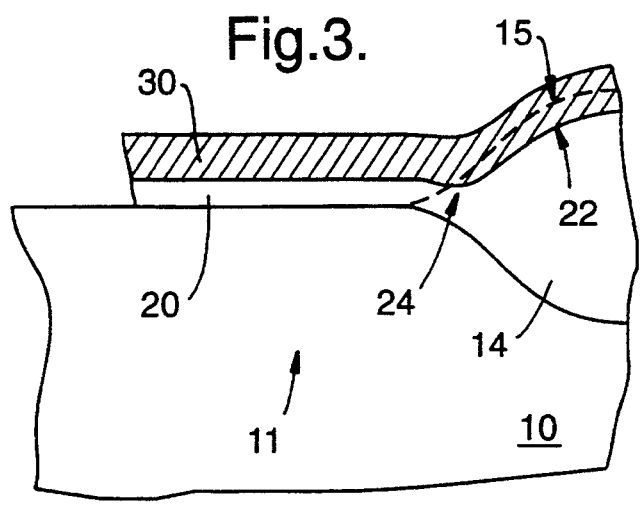

Referring to FIG. 3, when a polysilicon layer 30 is subsequently deposited, this dip 24 in the thin oxide at the edge of the active area gives rise to a curved region of the thin oxide structure between the semiconductor surface and the polysilicon layer 30, rather than the substantially flat thin oxide structure over the majority of the active area region. A separate step is formed in the semiconductor surface at the field oxide edge for each oxide removal and regrowth cycle that occurs in the process flow. As can be seen from FIG. 3, the final thickness of field oxide 14 is reduced as a result of the oxide etch and regrowth cycle. Top surface 22 of field oxide 14 is below the former top surface 15 which existed before the etch/regrowth cycle. The magnitude of this effect has been greatly exaggerated in FIGS. 1-3 for clarity of understanding. In most process descriptions it is rarely emphasized.

Excessive etching of thin active area oxides causes unnecessary and undesirable pullback and thinning of the field oxide. Such effects are known to make isolation between neighboring active areas more difficult, or at the very least, more area consuming. In contrast, the effects on the quality of subsequently grown oxides which are caused by the pull back of the field oxide due to overetching have not been appreciated.

Forming the "tunnel" oxide for an EEPROM process technology places numerous additional requirements on the process complexity, and specifically may increase the number of times an oxide is removed over the active area and a subsequent oxide re-grown. An additional oxide etch may be required to define the region to receive the heavy N+ region necessary below the tunnel oxide. A second additional etch may be required to define the region of the active area where the tunnel oxide should be formed. The simultaneous requirements that the tunnel oxide be formed above a heavily-doped N+ region and that the tunnel oxide be even higher quality than a traditional gate oxide used for FET's (given that currents are intentionally conducted through tunnel oxides in an EEPROM), is at apparent odds with the necessity of even more etch/regrowth operations over the active area to fabricate the tunnel structure.

The SURFACE QBD structure was used to determine the dependence of tunnel oxide QBD upon any surface effects. The measured results from the various process splits are plotted in FIG. 12. The pre-gate oxidation etch time was held at 1.3 minutes for all data points. The plotted curves show the measured SURFACE QBD as a function of both the tunnel opening etch time (ranging from 0.4 to 0.2 minutes) and the pre-anneal etch (either 0.2 minutes or omitted). As can be seen, the SURFACE QBD increased from 5.3 coul/cm$^2$ (data point 400) to 12.8 coul/cm$^2$ (data point 401). This represents a 142% improvement.

Figure 12:
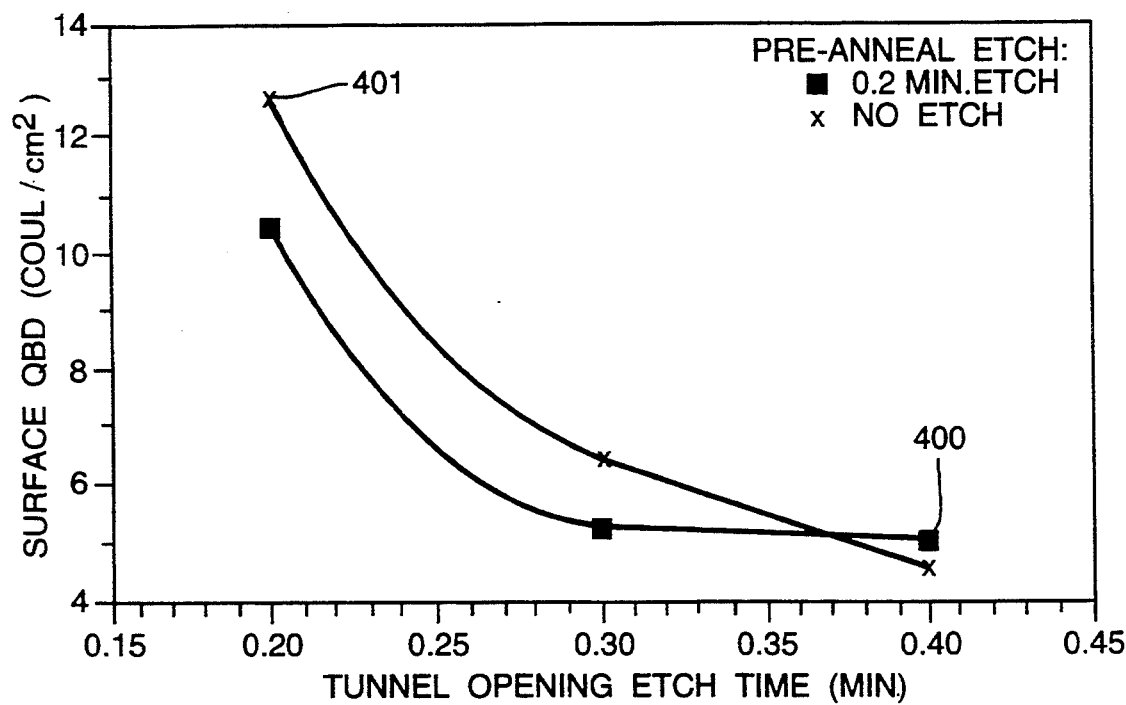
FIG. 12 is a chart which plots surface QBD measurements for various etch conditions.
Figure 13A:
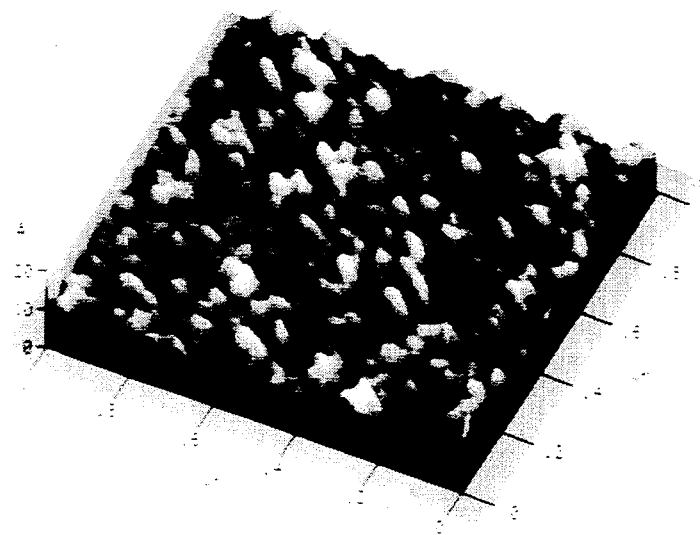
FIGS. 13A and 13B both illustrate an Atomic Force Microscopy (AFM) contour plot of the silicon surface prior to the tunnel oxidation, each for a particular etch condition.
Figure 13B:
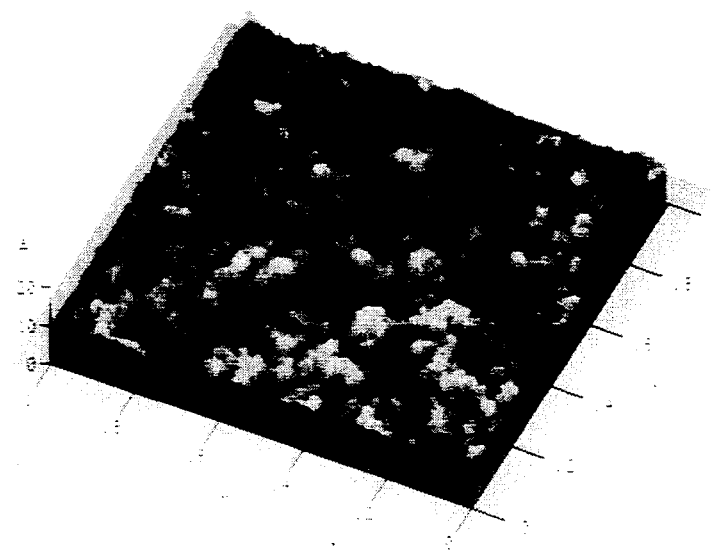

Since the SURFACE QBD structure contains only tunnel openings that do not overlap the field oxide edge, this improvement cannot be attributed to KOOI edge effects. As can be seen in FIG. 12, the difference in measured SURFACE QBD between the cases of performing the pre-anneal etch versus omitting the pre-anneal etch are relatively modest, and are no where near as striking as in the BULK QBD data of FIG. 11. The SURFACE QBD measurements should only be influenced by surface roughness since the field edge is not exposed. Using atomic force microscopy (AFM) the surface roughness was studied using two samples comparing tunnel opening etch times of 0.4 minutes versus 0.2 minutes (see FIGS. 13A and 13B). The AFM technique generates a three-dimensional contour plot of the silicon surface where the height variations are displayed by color gradients. A quantitative and qualitative improvement was demonstrated at the lower 0.2 minute tunnel opening etch time. The measured RMS surface roughness decreased from 1.79Å to 1.08Å when the tunnel opening etch time was reduced from 0.4 minutes (FIG 13A) down to 0.2 minutes (FIG. 13B). Visual analysis also revealed a much smoother surface, as can be seen in FIG. 13B.

Figure 14:
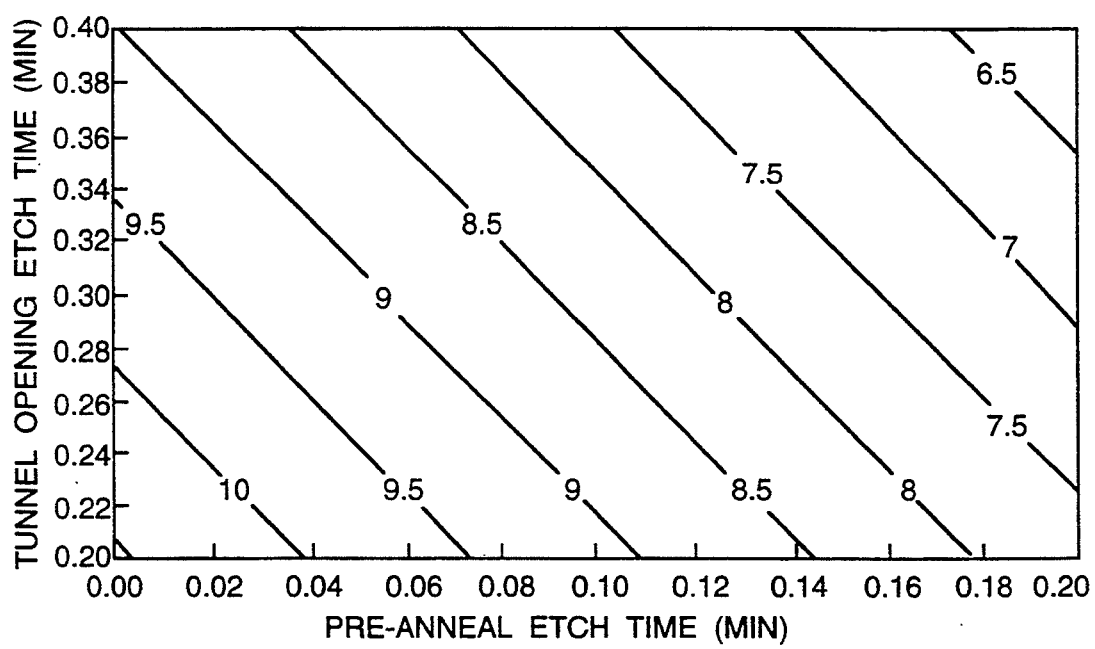
FIG. 14 is chart which plots an experimentally-fitted linear model of Bulk QBD versus pre-anneal etch time and tunnel opening etch time.

The BULK QBD parameter was observed to be a linear function of all three etch times in the process. Modeling of the BULK QBD was very successful (r-square=0.94) when linear input variables in etch times were used, and results in the equation:

$$BULK\ QBD = 14.40 - 14.39\ (Etch1) - 1.76(Etch2) - 7.76(Etch3)$$

where:
Etch1=pre-anneal etch time
Etch2=pre-(gate oxidation) etch time
Etch3=tunnel opening etch time Using this equation, one can predict the BULK QBD resulting from any combination of the three etch times. FIG. 14 shows a plot of BULK QBD in accordance with this equation, for varying pre-anneal etch and tunnel opening etch times, assuming a constant pre-gate oxidation etch time of 1.3 minutes.

While the above descriptions reference an EEPROM technology fabricated in a CMOS technology, the teachings of this disclosure can be advantageously applied to other semiconductor process technologies incorporating thin oxides. For example, a DRAM process requiring capacitors fabricated with very thin oxide dielectrics could benefit greatly from these teachings.

While the invention has been described with respect to the embodiments set forth above, the invention is not necessarily limited to these embodiments. For example, the invention is not necessarily limited to any particular transistor process technology. Moreover, variations in certain of the process steps can be practiced. For example, other etch time variations may yield similar improvements in oxide quality to those described herein. Furthermore, the teachings of this disclosure are believed to readily apply to oxides grown upon N-well surfaces, including over heavily-doped P+ regions. Accordingly, other embodiments, variations, and improvements not described herein are not necessarily excluded from the scope of the invention, which is defined by the following claims.

We claim:

1. In an integrated circuit fabrication process, a method for forming two oxide layers of different thicknesses on a semiconductor body, the thinner oxide being disposed over a heavily-doped region of the semiconductor body, comprising the steps of:

forming an active area in a semiconductor body having edges defined by field oxide regions;

growing a first oxide upon the surface of the active area;

implanting through a first region of the first oxide to form an implanted layer in the active area;

annealing the implanted layer with at least some of the first oxide remaining over the implanted layer to form a heavily-doped region;

removing the remaining first oxide subsequent to annealing the implanted layer, to expose the surface of the active area;

growing a second oxide on the exposed surface of the active area;

removing a first region of the second oxide, to expose a first region of the surface of the active area over the heavily-doped region, a second region of the second oxide remaining over a part of the active area; and oxidizing the semiconductor body to grow a third high quality oxide upon the exposed first surface region of the active area over the heavily-doped region and to thicken the second region of the second oxide.

2. A method as in claim 1 wherein the heavily-doped region abutts one of the edges of the active area, and wherein the third oxide abutts one of the edges of the active area.

3. A method as in claim 2 further comprising an RCA cleaning step after the implanting step and before the annealing step.

4. A method as in claim 3 wherein the heavily-doped region comprises an N+ region.

5. The method as in claim 4 wherein the first oxide growing step comprises growing the first oxide to a thickness of approximately 300Å and wherein the first oxide removing step comprises etching the first oxide for approximately 1.3 minutes using 10:1 HF.

6. The method as in claim 5 wherein the second oxide growing step comprises growing the second oxide to a thickness of approximately 225Å and wherein the second oxide removing step comprises etching the second oxide for approximately 0.2 minutes using a 6:1 buffered oxide etchant.

7. A method as in claim 6 wherein the semiconductor body comprises a P-well region.

8. A method as in claim 3 wherein the heavily-doped region comprises a P+ region.

9. In an integrated circuit fabrication process, a method for forming a heavily-doped region in a semiconductor body and for growing a first high quality oxide upon a surface of the semiconductor body over the heavily-doped region and for growing a second high quality oxide, of thickness greater than the first high quality oxide, upon the surface of the semiconductor body, comprising the steps of:

growing a first oxide upon the surface;

depositing a first photoresist layer on the first oxide;

removing a region of the first photoresist layer to expose a region of the first oxide, and leaving a remaining region of the first photoresist layer;

implanting through the exposed region of the first oxide to form an implanted layer in the semiconductor body;

removing the remaining region of the first photoresist layer;

cleaning the surface of the first oxide such that some thickness portion of the first oxide remains over the implanted layer subsequent to the cleaning;

annealing the implanted layer to form a heavily-doped region;

etching the first oxide subsequent to annealing the implanted layer, to expose the surface of the semiconductor body over the heavily-doped region;

growing a second oxide upon the exposed surface;

depositing a second photoresist layer upon the second oxide;

removing a region of the second photoresist layer to expose a region of the second oxide over the heavily-doped region, and leaving a remaining region of the second photoresist layer;

removing the exposed region of the second oxide, to expose the surface of the semiconductor body over the heavily-doped region, and leaving a remaining region of the second oxide;

removing the remaining region of the second photoresist layer, to expose the remaining region of the second oxide;

etching the remaining region of the second oxide to reduce its thickness; and growing a first high quality oxide upon the exposed surface of the semiconductor body while re-oxidizing the remaining region of the second oxide to form a second high quality oxide.

10. A method as in claim 9 wherein the cleaning step comprises an RCA clean step.

11. A method as in claim 10 wherein the heavily-doped region comprises an N+ region.

12. The method as in claim 11 wherein the first oxide growing step comprises growing the first oxide to a thickness of approximately 300Å and wherein the first oxide etching step comprises etching the first oxide for approximately 1.3 minutes using 10:1 HF.

13. The method as in claim 12 wherein the second oxide growing step comprises growing the second oxide to a thickness of approximately 225Å and wherein the second oxide removing step comprises etching the second oxide for approximately 0.2 minutes using a 6:1 buffered oxide etchant.

14. The method as in claim 13 wherein the second oxide etching step comprises etching the remaining region of the second oxide for approximately 50 seconds using 50:1 HF.

15. A method as in claim 14 wherein the semiconductor body comprises a P-well region.

16. A method for minimizing surface roughness of the surface of a semiconductor body over a previously formed and annealed heavily-doped region, for enhancing the quality of a subsequently grown oxide, comprising the steps of:

growing a first oxide upon the surface of the semiconductor body;

annealing the first oxide prior to any ion implantation therethrough;

removing the first oxide, to expose the surface of the semiconductor body over the heavily-doped region, so as to leave the surface of the semiconductor body having an RMS surface roughness of approximately 1.08Å.

* * * * *